United States Patent
Wakabayashi et al.

(10) Patent No.: US 11,551,960 B2
(45) Date of Patent: Jan. 10, 2023

(54) HELICAL PLUG FOR REDUCTION OR PREVENTION OF ARCING IN A SUBSTRATE SUPPORT

(71) Applicant: APPLIED MATERIALS, INC., Santa Clara, CA (US)

(72) Inventors: Reyn T. Wakabayashi, San Jose, CA (US); Hamid Noorbakhsh, Fremont, CA (US); Anwar Husain, Pleasanton, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 422 days.

(21) Appl. No.: 16/777,877

(22) Filed: Jan. 30, 2020

(65) Prior Publication Data
US 2021/0242063 A1    Aug. 5, 2021

(51) Int. Cl.
*H01L 21/683* (2006.01)
*H01J 37/32* (2006.01)

(52) U.S. Cl.
CPC ........ *H01L 21/6833* (2013.01); *H01J 37/321* (2013.01); *H01J 37/32064* (2013.01); *H01J 2237/20* (2013.01)

(58) Field of Classification Search
CPC ........... H01L 21/6833; H01L 21/67109; H01L 21/6831; H01L 21/68742; H01J 37/32064; H01J 37/321; H01J 2237/20; H01J 37/32577; H01J 37/32715
See application file for complete search history.

(56) References Cited

U.S. PATENT DOCUMENTS

| | | |
|---|---|---|
| 6,490,145 B1 | 12/2002 | Kholodenko et al. |
| D614,593 S | 4/2010 | Lee et al. |
| D623,673 S | 9/2010 | Duer et al. |
| 9,627,240 B2 * | 4/2017 | Yamaguchi ......... H01L 21/6831 |
| D790,039 S | 6/2017 | Hawrylchak et al. |
| D793,526 S | 8/2017 | Behdjat |
| D794,753 S | 8/2017 | Miller |
| D888,903 S | 6/2020 | Gunther et al. |
| D891,382 S | 7/2020 | Koppa et al. |
| D893,441 S | 8/2020 | Rao et al. |
| D913,979 S | 3/2021 | Babu et al. |
| 2009/0230636 A1 * | 9/2009 | Goto .................... H01L 21/6831 279/128 |
| 2016/0352260 A1 * | 12/2016 | Comendant ............ H02N 13/00 |

(Continued)

FOREIGN PATENT DOCUMENTS

| | | | |
|---|---|---|---|
| CN | 101795528 A | * 8/2010 | ........... C23C 16/505 |
| KR | 2011058058 A | * 6/2011 | |
| WO | WO-2020092412 A1 | * 5/2020 | |

*Primary Examiner* — Renan Luque
(74) *Attorney, Agent, or Firm* — Moser Taboada

(57) ABSTRACT

Embodiments of a plug for use in an electrostatic chuck are provided herein. In some embodiments, a plug for use in an electrostatic chuck includes a polymer sleeve having a central opening; and a core disposed in the central opening of the polymer sleeve, the core having a central protrusion and a peripheral ledge, wherein an outer surface of the core includes a helical channel extending from a lower surface of the core towards the peripheral ledge to at least partially define a gas flow path through the plug, and wherein the peripheral ledge is disposed between an upper surface of the polymer sleeve and the lower surface of the core.

12 Claims, 4 Drawing Sheets

(56) References Cited

U.S. PATENT DOCUMENTS

| | | | |
|---|---|---|---|
| 2017/0243726 A1* | 8/2017 | Kellogg | H01J 37/32697 |
| 2018/0158711 A1 | 6/2018 | Sasaki et al. | |
| 2018/0240688 A1 | 8/2018 | Hao et al. | |
| 2020/0105568 A1* | 4/2020 | Pilgrim | H01L 21/6833 |
| 2020/0286768 A1* | 9/2020 | Shiraishi | H01L 21/6831 |
| 2020/0335384 A1 | 10/2020 | Chiba et al. | |
| 2021/0166958 A1* | 6/2021 | Oshima | H01L 21/6833 |

* cited by examiner

HELICAL PLUG FOR REDUCTION OR PREVENTION OF ARCING IN A SUBSTRATE SUPPORT

FIELD

Embodiments of the present disclosure generally relate to substrate processing systems, and more specifically, to electrostatic chucks for use in substrate processing systems.

BACKGROUND

Electrostatic chucks are used for providing support to substrates within substrate processing systems, such as a plasma processing chamber. A type of electrostatic chuck includes holes to flow heat transfer fluid such as a gas between a support surface of the electrostatic chuck and a backside of the substrate. Generally, the gas fills the area between the electrostatic chuck and the substrate to enhance the uniformity and rate of heat transfer between the electrostatic chuck and the substrate.

In plasma processing chambers, the electrostatic chuck is subjected to high power radio frequency (RF) fields and high density plasmas in the vicinity of the substrate. In such plasma processing chambers, gas breakdown due to high electric field generation in the gas passages can undesirably occur. The inventors have observed that plasma formation in the holes can lead to arcing, especially in regions having high power radio frequency (RF) fields.

Accordingly, the inventors have provided an improved electrostatic chuck.

SUMMARY

Embodiments of a plug for use in an electrostatic chuck are provided herein. In some embodiments, a plug for use in an electrostatic chuck includes a polymer sleeve having a central opening; and a core disposed in the central opening of the polymer sleeve, the core having a central protrusion and a peripheral ledge, wherein an outer surface of the core includes a helical channel extending from a lower surface of the core towards the peripheral ledge to at least partially define a gas flow path through the plug, and wherein the peripheral ledge is disposed between an upper surface of the polymer sleeve and the lower surface of the core.

In some embodiments, an electrostatic chuck for use in a substrate processing chamber includes a metallic base plate having an upper surface opposite a lower surface; a dielectric plate disposed on the metallic base plate, wherein the dielectric plate has a lower surface that includes a cavity and an upper surface that includes a gas opening that extends to the cavity; an electrode embedded in the dielectric plate; a plug disposed in the cavity, wherein the plug comprises a core disposed in a central opening of a polymer sleeve, wherein the core includes a central protrusion and a peripheral ledge extending from the central protrusion to an outer surface of the core, and wherein the outer surface of the core includes a helical channel extending from a lower surface of the core towards the peripheral edge; and a gas flow path extending from the lower surface of the metallic base plate to the upper surface of the dielectric plate via the helical channel.

In some embodiments, an electrostatic chuck for use in a substrate processing chamber includes a metallic base plate having an upper surface opposite a lower surface; a dielectric plate disposed on the metallic base plate and having an upper surface opposite a lower surface, wherein the lower surface has a plurality of cavities and the upper surface includes a substrate receiving surface and a plurality of openings extending to a corresponding cavity of the plurality of cavities; an electrode embedded in the dielectric plate; a plug disposed in each one of the plurality of cavities and the plurality of openings, wherein the plug includes a helical channel; a gas flow path extending from the lower surface of the metallic base plate through the helical channel to the upper surface of the dielectric plate; and a porous plug disposed in the gas flow path in the metallic base plate and opposite the plug, wherein the porous plug includes a central portion and a peripheral portion, wherein the central portion is raised with respect to the peripheral portion.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
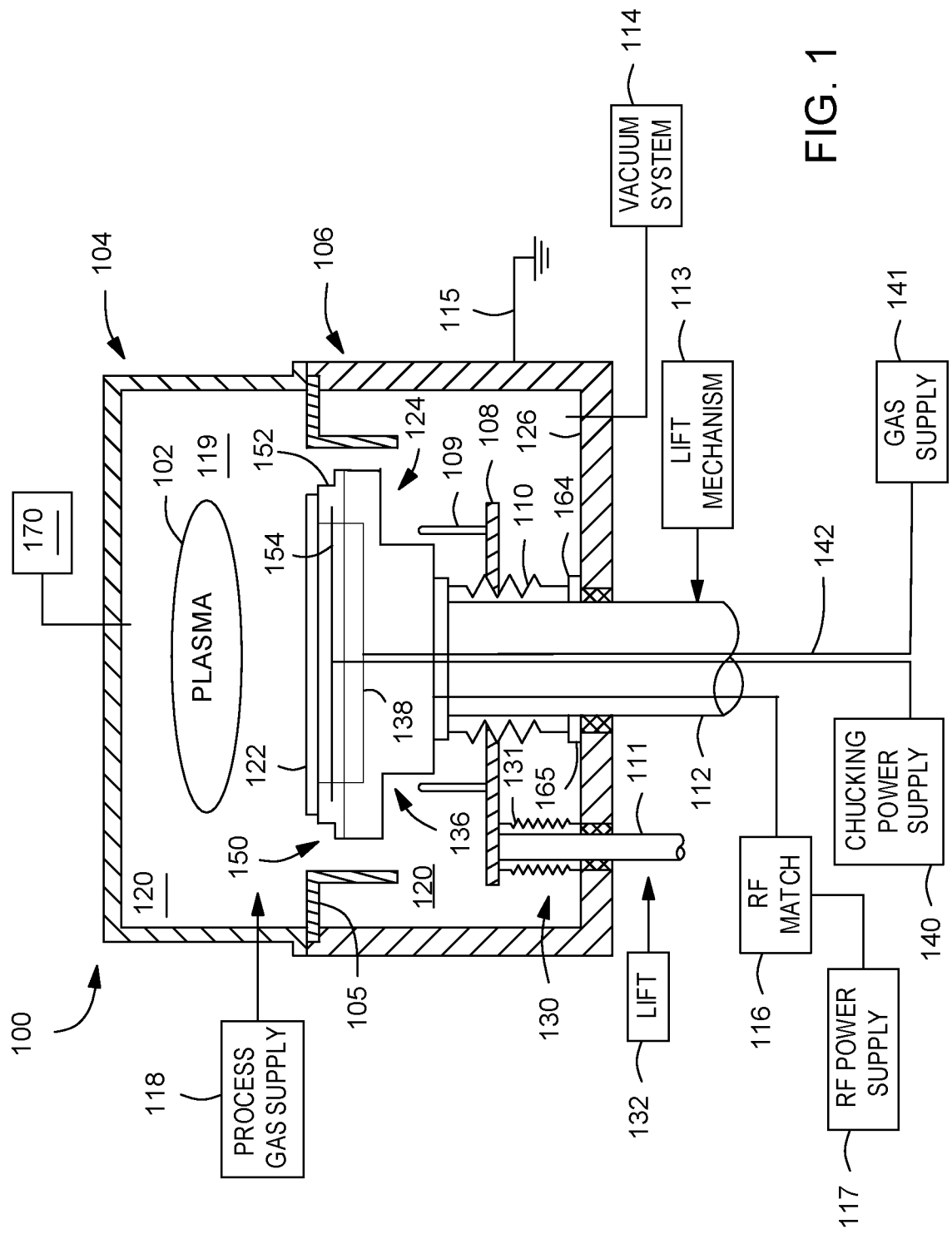
FIG. 1 depicts a schematic side view of a process chamber having an electrostatic chuck in accordance with at least some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of electrostatic chucks for use in a substrate processing chamber are provided herein. The electrostatic chuck includes a dielectric plate having a support surface to support a substrate. The dielectric plate is disposed on a metallic base plate. In some embodiments, one or more gas channels extend from a bottom surface of the electrostatic (e.g., bottom surface of the metallic base plate) to a top surface of the electrostatic chuck (e.g., top surface of the dielectric plate). The one or more gas channels are configured to provide backside gas, such as nitrogen (N) or helium (He), to the top surface of the electrostatic chuck to act as a heat transfer medium.

In some embodiments, a RF power source is coupled to the metallic base plate and configured to provide negative bias to a substrate being processed. As RF power is applied to the metallic base plate, a voltage on the metallic base plate and on the substrate is different depending on the impedance of the dielectric plate. The difference in respective voltages creates an electric field between the metallic base plate and the substrate, which can undesirably cause backside gas to be ionized and consequently lead to arcing.

FIG. 1 depicts a schematic side view of a process chamber (e.g., a plasma processing chamber) having an electrostatic chuck in accordance with at least some embodiments of the present disclosure. In some embodiments, the plasma processing chamber is an etch processing chamber. However, other types of processing chambers configured for different processes can also use or be modified for use with embodiments of the electrostatic chuck described herein.

The chamber 100 is a vacuum chamber which is suitably adapted to maintain sub-atmospheric pressures within a chamber interior volume 120 during substrate processing. The chamber 100 includes a chamber body 106 covered by a lid 104 which encloses a processing volume 119 located in the upper half of chamber interior volume 120. The chamber 100 may also include one or more shields 105 circumscribing various chamber components to prevent unwanted reaction between such components and ionized process material. The chamber body 106 and lid 104 may be made of metal, such as aluminum. The chamber body 106 may be grounded via a coupling to ground 115.

A substrate support 124 is disposed within the chamber interior volume 120 to support and retain a substrate 122, such as a semiconductor wafer, for example, or other such substrate as may be electrostatically retained. The substrate support 124 may generally comprise an electrostatic chuck 150 (described in more detail below with respect to FIG. 3) and a hollow support shaft 112 for supporting the electrostatic chuck 150. The electrostatic chuck 150 comprises a dielectric plate 152 having one or more electrodes 154 disposed therein and a metallic base plate 136. The hollow support shaft 112 provides a conduit to provide, for example, backside gases, process gases, fluids, coolants, power, or the like, to the electrostatic chuck 150.

In some embodiments, the hollow support shaft 112 is coupled to a lift mechanism 113, such as an actuator or motor, which provides vertical movement of the electrostatic chuck 150 between an upper, processing position (as shown in FIG. 1) and a lower, transfer position (not shown). A bellows assembly 110 is disposed about the hollow support shaft 112 and is coupled between the electrostatic chuck 150 and a bottom surface 126 of chamber 100 to provide a flexible seal that allows vertical motion of the electrostatic chuck 150 while preventing loss of vacuum from within the chamber 100. The bellows assembly 110 also includes a lower bellows flange 164 in contact with an o-ring 165 or other suitable sealing element which contacts the bottom surface 126 to help prevent loss of chamber vacuum.

The hollow support shaft 112 provides a conduit for coupling a backside gas supply 141, a chucking power supply 140, and RF sources (e.g., RF plasma power supply 170 and RF bias power supply 117) to the electrostatic chuck 150. The backside gas supply 141 is disposed outside of the chamber body 106 and supplies heat transfer gas to the electrostatic chuck 150. In some embodiments, RF plasma power supply 170 and RF bias power supply 117 are coupled to the electrostatic chuck 150 via respective RF match networks (only RF match network 116 shown). In some embodiments, the substrate support 124 may alternatively include AC, DC, or RF bias power.

A substrate lift 130 can include lift pins 109 mounted on a platform 108 connected to a shaft 111 which is coupled to a second lift mechanism 132 for raising and lowering the substrate lift 130 so that the substrate 122 may be placed on or removed from the electrostatic chuck 150. The electrostatic chuck 150 may include thru-holes to receive the lift pins 109. A bellows assembly 131 is coupled between the substrate lift 130 and bottom surface 126 to provide a flexible seal which maintains the chamber vacuum during vertical motion of the substrate lift 130.

The electrostatic chuck 150 includes gas distribution channels 138 extending from a lower surface of the electrostatic chuck 150 to various openings in an upper surface of the electrostatic chuck 150. The gas distribution channels 138 are in fluid communication with the backside gas supply 141 via gas conduit 142 to control the temperature and/or temperature profile of the electrostatic chuck 150 during use.

The chamber 100 is coupled to and in fluid communication with a vacuum system 114 which includes a throttle valve (not shown) and vacuum pump (not shown) which are used to exhaust the chamber 100. The pressure inside the chamber 100 may be regulated by adjusting the throttle valve and/or vacuum pump. The chamber 100 is also coupled to and in fluid communication with a process gas supply 118 which may supply one or more process gases to the chamber 100 for processing a substrate disposed therein.

In operation, for example, a plasma 102 may be created in the chamber interior volume 120 to perform one or more processes. The plasma 102 may be created by coupling power from a plasma power source (e.g., RF plasma power supply 170) to a process gas via one or more electrodes near or within the chamber interior volume 120 to ignite the process gas and creating the plasma 102. A bias power may also be provided from a bias power supply (e.g., RF bias power supply 117) to the one or more electrodes 154 within the electrostatic chuck 150 to attract ions from the plasma towards the substrate 122.

Figure 2:
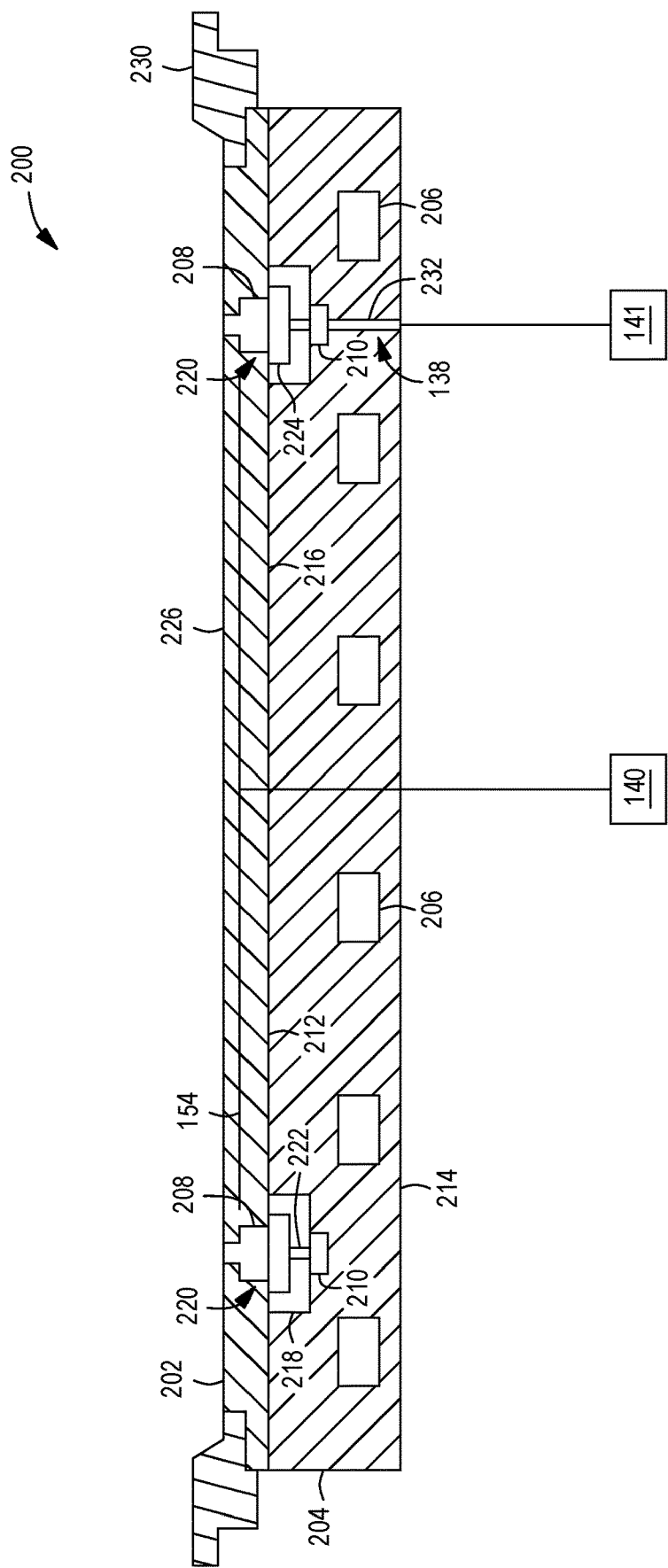
FIG. 2 depicts a schematic side view of an electrostatic chuck in accordance with at least some embodiments of the present disclosure.

FIG. 2 depicts a schematic side view of an electrostatic chuck 200 in accordance with at least some embodiments of the present disclosure. In some embodiments, the electrostatic chuck 200 is the electrostatic chuck 150 as discussed above with respect to FIG. 1. The electrostatic chuck 200 includes a metallic base plate 204 having an upper surface 212 opposite a lower surface 214. In some embodiments, the metallic base plate 204 is made of aluminum (Al). In some embodiments, the metallic base plate 204 includes cooling channels 206 configured to flow a coolant therethrough.

A dielectric plate 202 is disposed on and coupled to the metallic base plate 204. In some embodiments, the dielectric plate 202 is made of aluminum nitride (AlN). One or more electrodes 154 are embedded in the dielectric plate 202 and coupled to the chucking power supply 140. The dielectric plate 202 has a lower surface 216 opposite an upper surface 226. The upper surface 226 corresponds with a substrate receiving surface. The lower surface 216 includes one or more cavities 208. In some embodiments, an edge ring 230 is disposed at least one of on or about the dielectric plate 202. In some embodiments, the edge ring 230 is made of silicon (Si).

In some embodiments, the one or more cavities 208 extend from the lower surface 216 to the upper surface 226. In some embodiments, the one or more cavities 208 extend from the lower surface 216 and partially through the dielectric plate 202. In some embodiments, the one or more cavities 208 are disposed about dielectric plate 202 at locations equidistant from a central axis of the dielectric plate 202. In some embodiments, the one or more cavities 208 are disposed in a peripheral region of the dielectric plate 202.

A plug 220 is disposed in each of the one or more cavities 208. In some embodiments, the plug 220 is advantageously press-fit into a respective cavity so that there is no gap therebetween, reducing the likelihood of arcing. In some embodiments, a top portion of the plug 220 is narrower than a bottom portion of the plug 220 to aid in placing and press-fitting the plug 220 into a respective cavity. The plug 220 (or any of the plugs discussed below) comprises aluminum oxide (Al$_2$O$_3$) or aluminum nitride (AlN), for example. The plug 220 (or any of the plugs discussed below) can comprise other materials.

A gas flow path extends from the lower surface 214 of the metallic base plate 204 to the upper surface 226 of the dielectric plate 202 via gas distribution channels 138 and the plug 220. In some embodiments, the gas distribution channels 138 include a first channel 232 extending from the lower surface 214 of the metallic base plate 204 to an annular channel 210 disposed in the metallic base plate 204. In some embodiments, the annular channel 210 is disposed in a peripheral region of the metallic base plate 204.

In some embodiments, a cap ring 218 is disposed between the upper surface of the 212 metallic base plate 204 and the annular channel 210 to cover the annular channel 210. In some embodiments, the cap ring 218 is made of the same material as the metallic base plate 204. In some embodiments, the cap ring 218 includes one or more porous plugs 224 disposed therein adjacent an upper surface of the cap ring 218. In some embodiments, the porous plugs 224 are made of ceramic or polymer. The porous plugs 224 are disposed opposite each of the one or more plugs 220. In some embodiments, the porous plugs 224 have a porosity of about 30% to about 60% (e.g., a percent open volume of the porous plug). In some embodiments, the cap ring 218 has a constant width. In some embodiments, the cap ring 218 is wider at portions corresponding with the porous plugs 225 and narrower therebetween. In some embodiments, the cap ring 218 includes one or more second channels 222 extending through the cap ring 218 to fluidly couple the annular channel 210 to the one or more porous plugs 224. The one or more porous plugs 224 are configured to facilitate a flow of gas from the one or more second channels 222 to the upper surface 212 of the metallic base plate 204.

Figure 3:
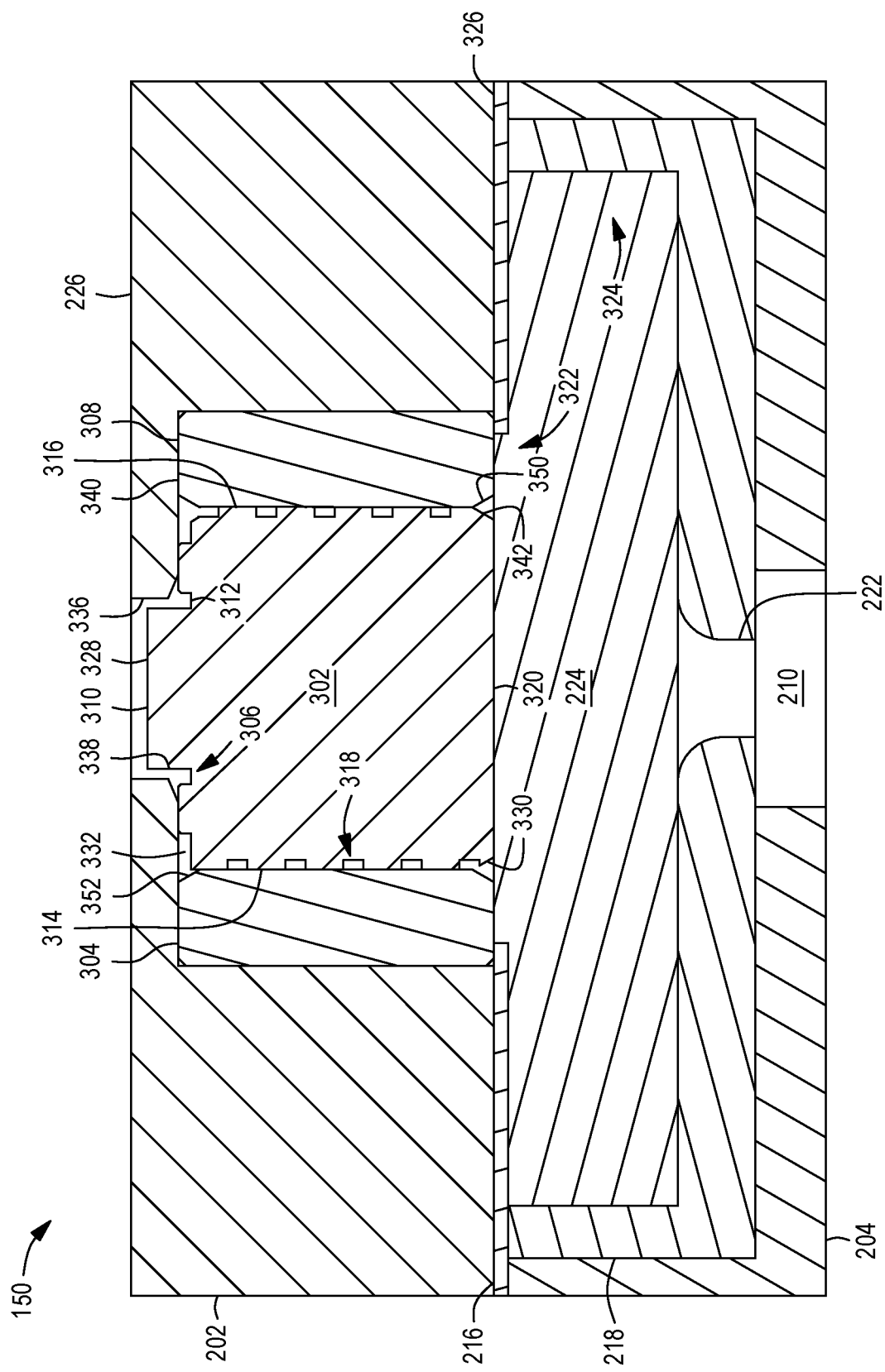
FIG. 3 depicts a partial cross-sectional side view of an electrostatic chuck in accordance with at least some embodiments of the present disclosure.

FIG. 3 depicts a partial cross-sectional side view of an electrostatic chuck 150 in accordance with at least some embodiments of the present disclosure. A plug 220 is disposed in the electrostatic chuck 150. The plug 220 includes a core 302 press-fit in a central opening 314 of a polymer sleeve 304 to advantageously reduce the likelihood of arcing. In some embodiments, the polymer sleeve 304 is made of polytetrafluoroethylene or any other suitable material. In some embodiments, the core 302 is made of aluminum oxide (Al$_2$O$_3$), aluminum nitride (AlN), or any other suitable material. In some embodiments, a top surface 328 of the core 302 is disposed within the dielectric plate 202. In some embodiments, the top surface 328 is coplanar with the upper surface 226 of the dielectric plate 202.

The core 302 includes a central protrusion 310 extending from an upper surface 312 of the core 302. The core 302 includes a peripheral ledge 306 disposed about the central protrusion 310. In some embodiments, the peripheral ledge 306 extends from the central protrusion 310 to the outer surface 316 of the core 302. In some embodiments, an outer surface 334 of the central protrusion 310 is concentric with the outer surface 316 of the core 302.

An outer surface 316 of the core 302 includes a helical channel 318 extending from a lower surface 320 of the core 302 towards the peripheral ledge 306 to advantageously reduce the likelihood of arcing. In some embodiments, the helical channel 318 extends from the lower surface 320 to the peripheral ledge 306. The helical channel 318 at least partially defines a gas flow path through the plug 220. In some embodiments, the gas flow path extends from the lower surface 214 of the metallic base plate 204 to the upper surface 226 of dielectric plate 202 via the helical channel 318. In some embodiments, the gas flow path extends between the peripheral ledge 306 and a lower surface 340 of the cavity 208. In some embodiments, the peripheral ledge 306 is disposed between an upper surface 308 of the polymer sleeve 304 and the lower surface 320 of the core 302. In some embodiments, the upper surface 308 of the polymer sleeve 304 abuts the lower surface 340 of the cavity 208. In some embodiments, the helical channel 318 has a depth of about 0.001 inches to about 0.015 inches.

In some embodiments, an upper annular channel 332 is disposed between the polymer sleeve 304 and the core 302. In some embodiments, an upper interior edge 352 of the polymer sleeve 304 is chamfered to at least partially define the upper annular channel 332. In some embodiments, a lower edge 330 of the core 302 is chamfered to define a lower annular channel 342 that fluidly couples the porous plug 224 and the helical channel 318. In some embodiments, a lower interior edge 350 of the polymer sleeve 304 is chamfered to define the lower annular channel 342. In some embodiments, both the lower edge 330 of the core 302 and the lower interior edge of the polymer sleeve 304 are chamfered to define the lower annular channel 342.

A porous plug 224 is disposed in the gas flow path in the metallic base plate 204 and opposite the plug 220. In some embodiments, a bond layer 326 is disposed between the porous plug 224 and the dielectric plate 202 to provide a seal therebetween. In some embodiments, the porous plug 224 includes a central portion 322 and a peripheral portion 324. In some embodiments, the central portion 322 is raised with respect to the peripheral portion 324. In some embodiments, the central portion 322 has an outer diameter that is greater than an outer diameter of the core 302. In some embodiments, the central portion 322 has an outer diameter that is less than an outer diameter of the plug 220. In some embodiments, the central portion 322 is raised from the peripheral portion 324 by an amount similar to a thickness of the bond layer 326 to reduce or prevent gas leakage from the gas flow path.

Figure 4:
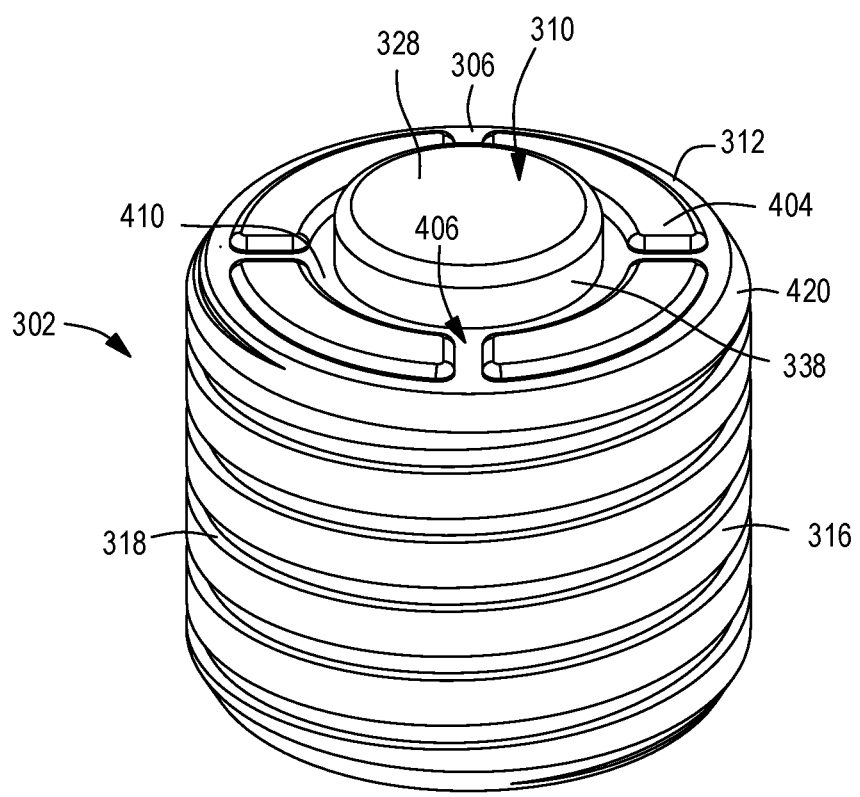
FIG. 4 depicts an isometric view of a plug in accordance with at least some embodiments of the present disclosure.

FIG. 4 depicts an isometric view of a plug 220 in accordance with at least some embodiments of the present disclosure. In some embodiments, the peripheral ledge 306 includes a plurality of raised portions 404 extending from the peripheral ledge 306. In some embodiments, the plurality of raised portions 404 abut the lower surface 340 of the cavity 208. In some embodiments, the plurality of raised portions 404 define a plurality of radial channels 406 therebetween that are fluidly coupled to the upper annular channel 332. In some embodiments, the plurality of raised portions 404 comprise four raised portions to define four radial channels of the plurality of radial channels 406. In some embodiments, the plurality of raised portions 404 have rounded edges.

In some embodiments, the core 302 includes an inner annular channel 410 disposed between the plurality of raised portions 404 and an outer surface 338 of the central protrusion 310. The upper surface 226 of the dielectric plate 202 includes gas openings 336. In some embodiments, the gas flow path extends from the helical channel 318 to the upper surface 226 of the dielectric plate 202 via the upper annular channel 332, the plurality of radial channels 406, the inner annular channel 410, and a gap between each of the gas openings 336 and the outer surface 338 of the central protrusion 310. In some embodiments, the helical channel 318 extends from an upper peripheral edge 420 of the core 302. In some embodiments, the upper peripheral edge 420 is chamfered from the upper surface 312 of the core 302. In some embodiments, an upper surface of the plurality of raised portions 404 is substantially coplanar with the upper surface 308 of the polymer sleeve 304.

While the foregoing is directed to embodiments of the present disclosure, other and further embodiments of the disclosure may be devised without departing from the basic scope thereof.

The invention claimed is:

1. An electrostatic chuck for use in a substrate processing chamber, comprising:
    a metallic base plate having an upper surface opposite a lower surface;
    a dielectric plate disposed on the metallic base plate, wherein the dielectric plate has a lower surface that includes a cavity and an upper surface that includes a gas opening that extends to the cavity;
    an electrode embedded in the dielectric plate;
    a plug disposed in the cavity, wherein the plug comprises a core disposed in a central opening of a polymer sleeve, wherein the core includes a central protrusion and a peripheral ledge extending from the central protrusion to an outer surface of the core, and wherein the outer surface of the core includes a helical channel extending from a lower surface of the core towards the peripheral ledge; and
    a gas flow path extending from the lower surface of the metallic base plate to the upper surface of the dielectric plate via the helical channel.

2. The electrostatic chuck of claim 1, further comprising a porous plug disposed in the gas flow path in the metallic base plate and opposite the plug.

3. The electrostatic chuck of claim 2, further comprising a bond layer disposed between the porous plug and the dielectric plate to provide a seal therebetween.

4. The electrostatic chuck of claim 1, wherein a top surface of the plug is disposed within the dielectric plate.

5. The electrostatic chuck of claim 1, wherein an outer surface of the central protrusion is concentric with the outer surface of the core.

6. The electrostatic chuck of claim 1, wherein the peripheral ledge includes a plurality of raised portions abutting a bottom surface of the cavity, wherein the plurality of raised portions define a plurality of radial channels therebetween.

7. The electrostatic chuck of claim 6, wherein the gas flow path extends from the plurality of radial channels to the upper surface of the dielectric plate via a gap between a gas opening of the dielectric plate and an outer surface of the central protrusion.

8. An electrostatic chuck for use in a substrate processing chamber, comprising:
    a metallic base plate having an upper surface opposite a lower surface;
    a dielectric plate disposed on the metallic base plate and having an upper surface opposite a lower surface, wherein the lower surface has a plurality of cavities and the upper surface includes a substrate receiving surface and a plurality of openings extending to a corresponding cavity of the plurality of cavities;
    an electrode embedded in the dielectric plate;
    a plug disposed in each one of the plurality of cavities and the plurality of openings, wherein the plug includes a helical channel;
    a gas flow path extending from the lower surface of the metallic base plate through the helical channel to the upper surface of the dielectric plate; and
    a porous plug disposed in the gas flow path in the metallic base plate and opposite the plug, wherein the porous plug includes a central portion and a peripheral portion, wherein the central portion is raised with respect to the peripheral portion.

9. The electrostatic chuck of claim 8, wherein the plug includes a plurality of radial channels extending radially inward from the helical channel.

10. The electrostatic chuck of claim 8, wherein the plug comprises a core disposed in a central opening of a polymer sleeve.

11. The electrostatic chuck of claim 8, wherein the dielectric plate is made of aluminum nitride (AlN).

12. The electrostatic chuck of claim 8, wherein an upper surface of the plug is disposed between the upper surface of the dielectric plate and a bottom surface of the plurality of cavities.

* * * * *